(12) United States Patent
Baldwin et al.

(10) Patent No.: US 8,438,526 B2
(45) Date of Patent: May 7, 2013

(54) METHOD FOR MINIMIZING TRANSISTOR AND ANALOG COMPONENT VARIATION IN CMOS PROCESSES THROUGH DESIGN RULE RESTRICTIONS

(75) Inventors: Gregory Charles Baldwin, Plano, TX (US); Younsung Choi, Plano, TX (US); Oluwamuyiwa Oluwagbemiga Olubuyide, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 12/889,116

(22) Filed: Sep. 23, 2010

(65) Prior Publication Data
US 2012/0078604 A1 Mar. 29, 2012

(51) Int. Cl.
*G06F 17/50* (2006.01)
*G06F 9/455* (2006.01)

(52) U.S. Cl.
USPC ............................. 716/136; 716/108; 716/134

(58) Field of Classification Search .................. 716/108, 716/134, 136
See application file for complete search history.

(56) References Cited

U.S. PATENT DOCUMENTS

| | | | |
|---|---|---|---|
| 8,024,675 B1 * | 9/2011 | Gupta et al. | 716/54 |
| 2005/0251771 A1 * | 11/2005 | Robles | 716/5 |
| 2009/0313595 A1 * | 12/2009 | Moroz et al. | 716/10 |
| 2010/0169847 A1 * | 7/2010 | Gupta et al. | 716/2 |
| 2011/0257954 A1 * | 10/2011 | Soni et al. | 703/14 |

* cited by examiner

*Primary Examiner* — Suresh Memula
(74) *Attorney, Agent, or Firm* — Alan A. R. Cooper; Wade J. Brady, III; Frederick J. Telecky, Jr.

(57) ABSTRACT

Various embodiments provide an integrated circuit (IC) design method and design kit for reducing context variations through design rule restrictions. The design method can be applied to components (e.g., analog blocks) with a context variation in an IC design. By drawing a cover layer over such components, context-variation-reduction design rule restrictions can be applied to reduce the context variations.

15 Claims, 3 Drawing Sheets

METHOD FOR MINIMIZING TRANSISTOR AND ANALOG COMPONENT VARIATION IN CMOS PROCESSES THROUGH DESIGN RULE RESTRICTIONS

FIELD OF THE INVENTION

This invention relates generally to the field of integrated circuit (IC) design and more particularly to methods for reducing context variations through design rule restrictions during IC design.

BACKGROUND OF THE INVENTION

Designing integrated circuit (IC) devices such as microprocessors, memory devices, logic devices, radio frequency identification (RFID) tags, etc. can include: production of the initial circuit design schematic, electrical simulation of the circuit design to verify proper functionality, conversion of the circuit schematic into a three dimensional physical translation or graphical representation of the schematic devices, verification that the physical device translation is analogous to the circuit design and will provide a functioning device, failure analysis, and optimization of circuit and physical designs to ensure device reliability, stability, and manufacturability.

Computer aided design (CAD) software tools and other electronic design automation (EDA) tools are used for all stages of IC design. Design tools from several different vendors are currently used in the semiconductor industry, including Cadence® (Cadence Design Systems, Inc., San Jose, Calif.), Knights Camelot™ (Magma® Design Automation, San Jose, Calif.), and SPICE (SiSoft, Maynard, Mass.), as well as other design environments.

One goal in IC manufacture is to faithfully reproduce the original IC design on a semiconductor chip or wafer. However, as the size of IC devices is reduced and the device density increases, variability between components built on the semiconductor chip becomes problematic. Additionally, as high levels of strain are introduced to IC technologies to boost performance, such component variations (also referred herein as "context variations") as well as parameter shifts may further increase. Consequently, the context variations can cause the circuit corresponding to the design or layout to behave differently than expected when embodied on the semiconductor chip. For example, during IC manufacturing processes, analog components can be significantly degraded by context variations because many analog designs require tight tolerances and very good matching between components. Consequently, the degraded analog components can be non-functional.

Conventional solutions to address the context variations involve characterizing and including the context variations in component models as for digital/logic designs, but without reducing the variations.

Thus, there is a need to overcome these and other problems of the prior art and to provide a design method and design kit for reducing or minimizing context variations in IC processes through design rule restrictions.

SUMMARY OF THE INVENTION

According to various embodiments, the present teachings include an IC design method. In this design method, components passing a design rule but having a context variation in an IC design can be determined and can be identified by drawing a cover layer there-over. Context-variation-reduction design rule restrictions can then be applied to the identified components to reduce the context variation.

According to various embodiments, the present teachings also include a method of designing an IC device. In this method, analog blocks with a context variation in an IC design can be identified by drawing a cover layer there-over. Context-variation-reduction design rule restrictions can be applied to the identified analog blocks to reduce the context variation. Context-variation-reduction design rule restrictions can be included in a simulation. In this manner, a drawing layer can be formed to include analog blocks and the cover layer placed there-over. The analog blocks can be subject to the context-variation-reduction design rule restrictions and analyzed by the simulation.

According to various embodiments, the present teachings further include a design kit, which is software for designing integrated circuit layouts. The design kit can include a drawing layer including a cover layer placed over analog blocks having a context variation in an IC design, wherein the analog blocks are subject to context-variation-reduction design rule restrictions to reduce the context variation of the IC design. The design kit can also include a design rule checker code with checks to enforce the context-variation-reduction design rule restrictions; and an optional parameterized cell (p-cell) for a designer to generate a design-rule clean layout.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

It should be noted that some details of the figures have been simplified and are drawn to facilitate understanding of the inventive embodiments rather than to maintain strict structural accuracy, detail, and scale.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Various embodiments provide an integrated circuit (IC) design method and design kit for reducing or minimizing component variations (also referred to herein as "context variations") through design rule restrictions. The disclosed design method can be applied to any conventional IC design by adding a cover layer to identify components that pass conventional design rules but require less variations and more predictability for manufacturing. Additional design rule restrictions can then be applied to the identified components to reduce their context variations. Such additional design rule restrictions can also be referred to herein as "context-variation-reduction design rule restrictions."

Figure 1:
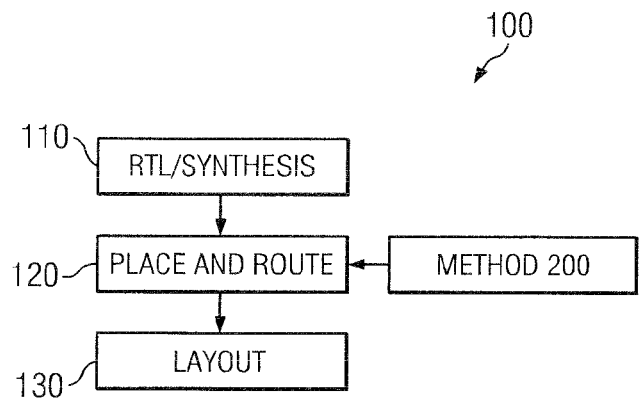
FIG. 1 depicts a flowchart of an exemplary IC design method in accordance with various embodiments of the present teachings.

FIG. 1 depicts a flowchart of an exemplary IC design method 100 in accordance with various embodiments of the present teachings.

The IC design method 100 can include a front-end design flow before the physical layout design, such as a register-transfer level (RTL) design module 110. For example, the IC designer can program RTL code to describe a logic function requirement of the circuit so as to generate a RTL file.

Synthesis software can be used to verify the generated RTL file. For example, the synthesis software can be coupled to a library of standard cells. A typical known standard cell library can include a plurality of different cell types, such as AND, NOR, flip-flop and inverter cells, and each cell is available in several different sizes. The synthesis software can analyze the logic function of the RTL file with an implementation of that function using various types of standard cells that meet the specification.

After the logic functionality is defined, the design flow can proceed to the back-end portion, for example, the design method 100 can include an auto place-and-route (APR) module 120. For example, EDA tool can place and route standard cells for the RTL file that has passed the verification of the synthesis software. Other than standard cells, input/output (I/O) cells and IP/Macro can also be placed in various locations according to the functional connectivity and the optimization of signal routing. After APR, a text netlist can be generated including a list of cells required and the necessary connections between them, and the IC designer can choose the cells according to the specification of the circuit.

A simulator, for example, a SPICE (simulation program with integrated circuits emphasis) simulator can take the text netlist to check the integrity of circuit designs and to predict circuit behavior. For example, the effects of parameters such as temperature variation, doping concentration variation, and statistical process variations can be simulated to determine if an IC design is manufacturable.

However, as high levels of strain are introduced to IC technologies to boost performance, parameter shifts and context variations induced by conventional design layout may increase. Generally, an IC design can include digital/logic blocks, analog/mixed signal blocks, memory, Input/Output (I/O), and/or custom blocks. Of these, analog/mixed signal blocks, I/O, and memory are typically used as a single preformed unit (or hard macro) by the IC designer, whereas some of the other blocks, e.g., the logic, are constructed from a set of lower level sub-blocks, or standard cells, to enable a higher degree of customization and optimization.

Figure 2:
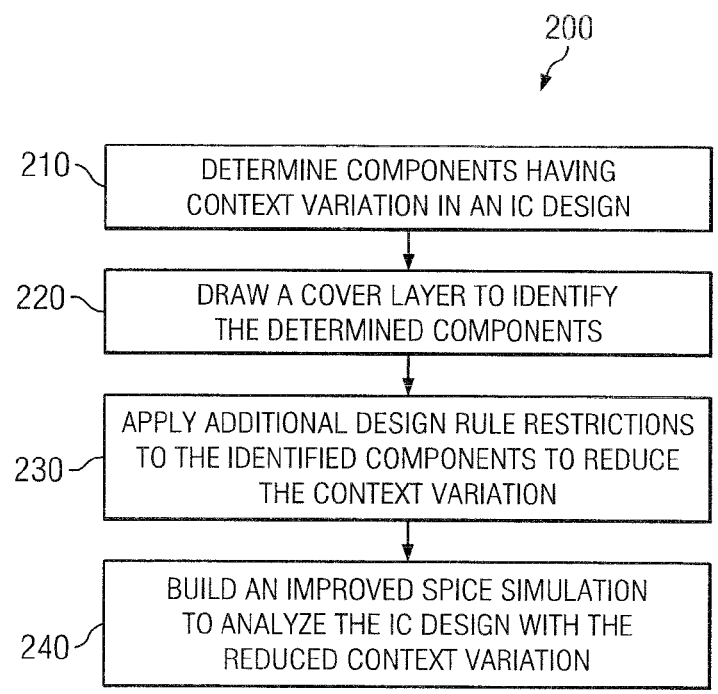
FIG. 2 depicts an exemplary design method for reducing context variations in accordance with various embodiments of the present teachings.

In embodiments, an IC design method and design kit for reducing context variations and for improving matching and predictability of the design can be provided. FIG. 2 depicts an exemplary design method for reducing context variations in accordance with various embodiments of the present teachings.

At 210 of FIG. 2, components that require less variation and more predictability in a conventional IC design can be determined by the designer. These components follow conventional design rules.

Figure 3:
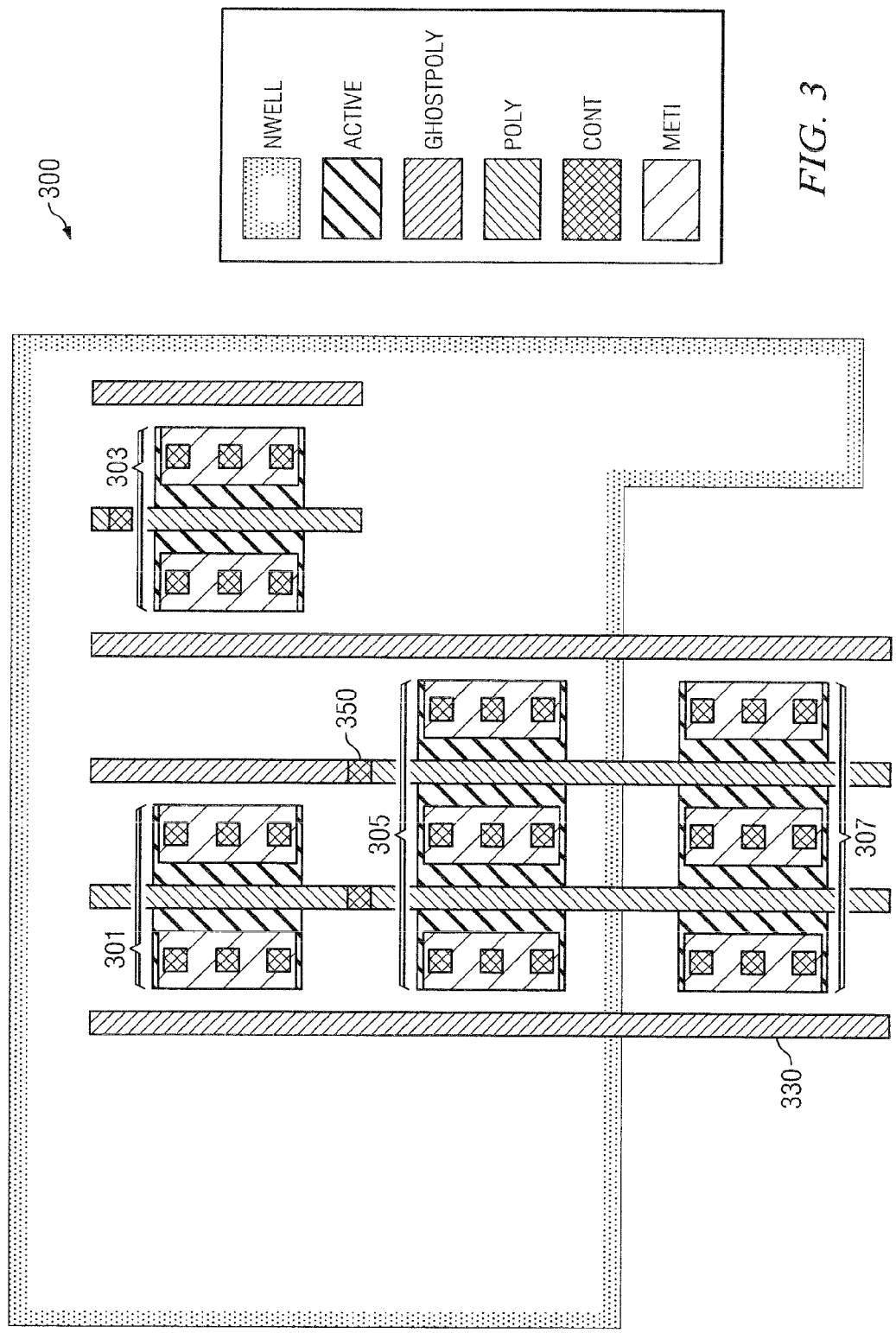
FIG. 3 depicts a conventional IC design.
Figure 4:
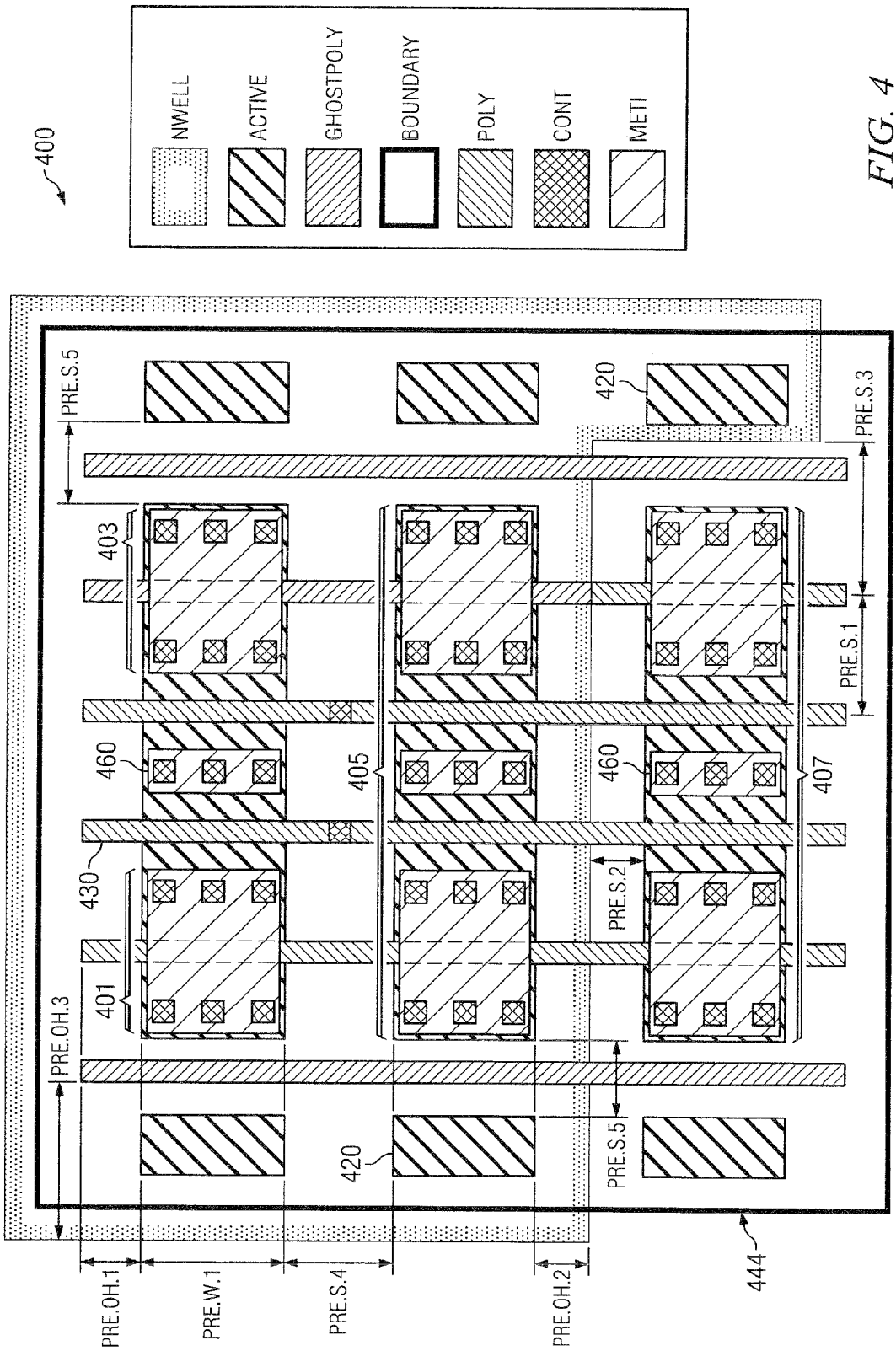
FIG. 4 depicts an exemplary drawing layer included in a design kit with respect to the conventional IC design of FIG. 3 in accordance with various embodiments of the present teachings.

For better understanding the design method 200 in FIG. 2, FIGS. 3-4 depict exemplary IC designs with respect to the method 200 in accordance with various embodiments of the present teachings. For example, FIG. 3 depicts a portion of a conventional IC design layout 300, which is designed for standard logic/digital transistors and is used as an example for illustration purposes. The design layout 300 can include the components determined by the designer that require less variations and more predictability for manufacturing.

As shown, the layout 300 includes a plurality of analog blocks including for example, CMOS transistors 301, 303, 305, and 307. The layout 300 also includes dummy gates 330 and contacts 350. The layout 300 passes standard design rules.

At 220 of FIG. 2, the determined component(s) at 210 can be identified by a cover layer. For example, as shown in FIG. 4, an exemplary drawing layer 400 can include a cover layer 444 placed over the circuit in FIG. 3 that includes all identified analog blocks, e.g., transistors 301, 303, 305, and 307.

At 230 of FIG. 2, context-variation-reduction design rule restrictions can then be specified and applied to the identified analog blocks of FIG. 3 by the designer to minimize the impact of context variations in the design. Due to the context-variation-reduction design rule restrictions, components or analog blocks in FIG. 3 can be re-arranged and/or re-drawn. In some cases, new components can be added according to the context-variation-reduction design rule restrictions. The application of the context-variation-reduction design rule restrictions can then lead to a drawing layer as shown in FIG. 4. As a result, the exemplary drawing layer 400 can include transistors 401, 403, 405, and 407 under the context-variation-reduction design rule restrictions, wherein the transistors 405 and 407 have been re-drawn based on the transistors 305 and 307 due to the context-variation-reduction design rule restrictions. Comparing FIG. 3 with FIG. 4, the context-variation-reduction design rule restrictions also require addition of dummy active regions 420, poly features 430, and metal contacts 460 as shown in FIG. 4.

At 240 of FIG. 2, a simulator, e.g., a SPICE simulator, can be used for the IC design to include the reduced context variations to check the integrity of circuit designs with the exemplary design rule restrictions and to predict circuit behavior. For example, the SPICE models can be built for analyzing components (see FIG. 4) with context-variation-reduction design rule restrictions and with less context variations as compared with components (see FIG. 3) without these context-variation-reduction design rule restrictions. In embodiments, the drawing layer 400 of FIG. 4 can be adjusted based on the analysis of the SPICE simulator. The SPICE simulator can allow designers to take advantage of the reduced variation and improved matching during their design.

Referring back to FIG. 1, the design method 100 can include a layout module 130. After optimized placement and routing at 120 of FIG. 1 with the method 200 of FIG. 2, a physical design layout can be created according to the drawing layer 400 of FIG. 4 to build components, e.g., analog circuit blocks, using the components with the cover layer of FIG. 4. The physical layout can be created, for example, in a GDS format, and finalized for further layout enhancement and sign-off verification. The design method 100 can also include design rule check (DRC) and layout vs. schematic (LVS) module as known to one of ordinary skill in the art.

Generally, DRC can be performed on the physical layout to verify that the manufacturer concerned process requirements have been satisfied. LVS can be performed such that the devices/interconnects are extracted to generate a netlist for comparison with an original design netlist. This step can also be referred to as sign-off verification. In one embodiment, SPICE module can be used to provide simulation capabilities for performance verifications of particular ICs.

In embodiments, in addition to the drawing layer 400, the exemplary design kit can also include, for example, a design rule checker code having checks to enforce the context-variation-reduction design rule restrictions; and optionally a parameterized cell (p-cell) for a designer to generate a design-rule clean layout.

In this manner, use of the cover layer 444 of FIG. 4 for identifying all analog blocks of FIG. 3 can allow specific design layout rules to be applied and can also allow SPICE models with reduced variations to be built for improving analog circuit design. In embodiments, the disclosed design method can be used in advanced CMOS technologies, especially those with higher strain-induced context variations. For example, the exemplary design methods depicted in FIGS. 1-2 and 4 can be used in advanced technology nodes including 45 nm technology node, 28 nm technology node, or other advanced technology nodes that use analog circuit blocks.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in non-conformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit (IC) design method comprising:
    determining components having a context variation in an IC design;
    drawing a cover layer over the determined components such that the components with the context variation are identified by the cover layer; and
    applying context-variation-reduction design rule restrictions to the identified components to reduce the context variation.

2. The method of claim 1, further comprising including the context-variation-reduction design rule restrictions in a SPICE simulation to analyze the components.

3. The method of claim 1, further comprising forming a drawing layer, wherein the drawing layer comprises components under the context-variation-reduction design rule restrictions, and the cover layer placed over the components.

4. The method of claim 3, further comprising generating a physical design layout based on the drawing layer.

5. The method of claim 1, wherein the step of applying context-variation-reduction design rule restrictions comprises re-arranging or re-drawing one or more components of the identified components according to the context-variation-reduction design rule restrictions.

6. The method of claim 1, wherein the step of applying context-variation-reduction design rule restrictions further comprises an addition of a dummy active region, a poly feature, or a contact according to the context-variation-reduction design rule restrictions.

7. The method of claim 1, wherein the components having the context variation comprise analog blocks.

8. The method of claim 1, wherein the IC design is for a 45 nm technology node or a 28 nm technology node.

9. The method of claim 3, wherein the drawing layer is included within a design kit.

10. A method of designing an integrated circuit (IC) device comprising:
    identifying analog blocks with a context variation in an IC design by drawing a cover layer over the analog blocks;
    applying context-variation-reduction design rule restrictions to the identified analog blocks to reduce the context variation;
    including the context-variation-reduction design rule restrictions in a SPICE simulation to analyze the IC design; and
    forming a drawing layer comprising analog blocks subject to the context-variation-reduction design rule restrictions analyzed by the SPICE simulation, and the cover layer placed over the analog blocks.

11. The method of claim 10, wherein the step of applying context-variation-reduction design rule restrictions comprises re-arranging or re-drawing one or more analog blocks of the identified analog blocks according to the context-variation-reduction design rule restrictions.

12. The method of claim 10, wherein the step of applying context-variation-reduction design rule restrictions further comprises addition of a dummy active region, a poly feature, or a metal contact according to the context-variation-reduction design rule restrictions.

13. The method of claim 10, wherein the analog blocks comprise CMOS transistors.

14. The method of claim 10, further comprising generating a physical design layout according to the drawing layer.

15. The method of claim 10 wherein the drawing layer is included within a design kit.

* * * * *